United States Patent
Greer et al.

(10) Patent No.: US 9,681,553 B2
(45) Date of Patent: Jun. 13, 2017

(54) CHANGING PRINTING CONTROL PARAMETERS BASED ON MEASURED SOLDER PASTE DEPOSITS IN CERTAIN SUBAREAS OF A PRINTED CIRCUIT BOARD

(71) Applicants: Mathew Greer, Glenrothes Fife (GB); Robert Gray, Buford, GA (US)

(72) Inventors: Mathew Greer, Glenrothes Fife (GB); Robert Gray, Buford, GA (US)

(73) Assignee: ASM ASSEMBLY SYSTEMS GMBH & CO. KG (DE)

( * ) Notice: Subject to any disclaimer, the term of this patent is extended or adjusted under 35 U.S.C. 154(b) by 0 days.

(21) Appl. No.: 14/302,677

(22) Filed: Jun. 12, 2014

(65) Prior Publication Data

US 2015/0050418 A1  Feb. 19, 2015

(30) Foreign Application Priority Data

Aug. 19, 2013  (EP) .................................... 13180942

(51) Int. Cl.
  *B05D 1/26* (2006.01)
  *H05K 3/12* (2006.01)
  (Continued)

(52) U.S. Cl.
  CPC ......... *H05K 3/1216* (2013.01); *B23K 1/0016* (2013.01); *B23K 3/0638* (2013.01);
  (Continued)

(58) Field of Classification Search
  USPC ...................... 427/8–10, 98.4, 256
  See application file for complete search history.

(56) References Cited

U.S. PATENT DOCUMENTS 5,862,973 A * 1/1999 Wasserman ............ B23K 31/12
  228/103
6,131,511 A * 10/2000 Wachi ..................... B41F 15/10
  101/126
(Continued)

FOREIGN PATENT DOCUMENTS

JP   2007-134406    *  5/2007
WO   WO 97/08655        3/1997

OTHER PUBLICATIONS

Office Action issued on Jun. 21, 2016 in corresponding EP Application No. 13 180 942.8.
(Continued)

*Primary Examiner* — Brian K Talbot
(74) *Attorney, Agent, or Firm* — Ostrolenk Faber LLP

(57) ABSTRACT

It is described a method for changing parameters for controlling a transfer of solder paste onto a printed circuit board (150, 250). The described method comprises (a) identifying first subareas (256, 258) of the printed circuit board (150, 250), which exhibit a first repeatability with respect to the amount of solder paste being supposed to be transferred onto the printed circuit board (150, 250), (b) identifying second subareas (252, 254) of the printed circuit board (150, 250), which exhibit a second repeatability with respect to the amount of solder paste being supposed to be transferred onto the printed circuit board (150, 250), wherein the first repeatability is smaller than the second repeatability, (c) transferring solder paste onto the printed circuit board (150, 250) at least at the second subareas (252, 254) of the printed circuit board (150, 250), (d) measuring the amount of solder paste which has been transferred to the second subareas (252, 254), and (e) changing the parameters for controlling a transfer of solder paste onto the printed circuit board (150, 250) in response to the measured amount of solder paste which has been transferred to the second subareas (252, 254). It is further described a corresponding processing
(Continued)

device, a system comprising such a processing device and a computer program for controlling and/or for carrying out such a method.

7 Claims, 3 Drawing Sheets

(51) Int. Cl.
  *H05K 3/00* (2006.01)
  *B23K 3/06* (2006.01)
  *H05K 3/34* (2006.01)
  *B23K 1/00* (2006.01)
  *C23C 2/10* (2006.01)
  *C23C 2/08* (2006.01)
  *C23C 2/00* (2006.01)
  *B23K 101/42* (2006.01)

(52) U.S. Cl.
  CPC ......... *H05K 3/0091* (2013.01); *H05K 3/3484* (2013.01); *B05D 1/26* (2013.01); *B23K 2201/42* (2013.01); *C23C 2/006* (2013.01); *C23C 2/08* (2013.01); *C23C 2/10* (2013.01); *H05K 2203/163* (2013.01)

(56) References Cited

U.S. PATENT DOCUMENTS

| | | | |
|---|---|---|---|
| 6,463,426 B1* | 10/2002 | Lipson | G06F 17/30247 |
| 6,622,054 B1* | 9/2003 | Okuda | G05B 19/41875 700/51 |
| 2002/0083570 A1 | 7/2002 | Inoue et al. | 29/428 |
| 2002/0180962 A1* | 12/2002 | Bellm | G01B 11/24 356/237.5 |
| 2004/0244613 A1* | 12/2004 | Barajas | H05K 3/1233 101/130 |
| 2007/0053577 A1 | 3/2007 | Schanz | 382/145 |
| 2007/0090164 A1* | 4/2007 | Barajas | H05K 3/1233 228/101 |
| 2008/0083816 A1* | 4/2008 | Leinbach | B23K 3/0638 228/102 |
| 2011/0221398 A1* | 9/2011 | Ferber, Jr. | H02J 7/0016 320/166 |
| 2015/0027328 A1* | 1/2015 | Gray | H05K 3/1216 101/126 |

OTHER PUBLICATIONS

Schutt J: Uberwachung Des Lotpastendrucks Fur SMT, F&M. Feinwerktechnik Mikrotechnik Messtechnik, Hanser, Munchen, DE, vol. 102, No. 11/12, Nov. 1, 1994 (Nov. 1, 1994), pp. 588-591, XP000477113, ISSN: 0944-1018.

Don Winton: "Process capability studies", Jan. 1, 1999, Jan. 1, 1999 (Jan. 1, 1999), pp. 1-16, XP007922484, retrieved from Internet: URL:http://profsite.um.ac.ir/~ahad/CPK.pdf [retrieved on Jan. 8, 1999].

* cited by examiner

CHANGING PRINTING CONTROL PARAMETERS BASED ON MEASURED SOLDER PASTE DEPOSITS IN CERTAIN SUBAREAS OF A PRINTED CIRCUIT BOARD

FIELD OF INVENTION

The present invention relates to the field of transferring solder paste onto a printed circuit board. In particular, the present invention relates to a method and to a processing device for changing parameters for controlling a transfer of solder paste onto a printed circuit board. Further, the present invention relates to a system comprising such a processing device and to a computer program for controlling and/or for carrying out such a method.

ART BACKGROUND

The automatic production of electronic assemblies typically starts with a printed circuit board (PCB) printing process, wherein an appropriate amount of solder paste is transferred to or applied at predefined locations within the PCB. These locations represent connection pads for terminals of electronic components which are mounted to the PCB by means of a surface mount placement process, e.g. a so called pick and place process carried out by an automatic placement machine. Later, the electronic components are secured by means of a soldering procedure which can be carried out e.g. within a reflow oven.

PCB printing is a process by which a viscous solder paste is deposited through aperture openings of a stencil onto a PCB. The configuration of the stencil apertures determines the basic layout of the deposits. For the printing process the stencil is aligned to the PCB and then brought in close to or in direct contact with the surface of the PCB. An angled blade, called a squeegee, is then used to drive the solder paste across the surface of the stencil at a controlled speed and force. As a result of such a print stoke the apertures on the stencil are filled with the solder paste. When the stencil is released from the PCB the resulting contents of the filled apertures are transferred to the PCB, thereby forming deposits. With one print stroke, thousands of deposits can be placed onto the PCB surface. After PCB printing the process can be repeated thousands of times with the same stencil onto further PCBs thereby creating a high throughput process.

Previously it has been estimated that between fifty to seventy percent of the total defects in PCB surface mount assembly lines are related to the PCB printing process, and that approximately thirty to fifty percent of the total manufacturing cost is due to test and rework expenses. Thus, the step of PCB printing with a stencil is considered as to be the most critical process in the PCB manufacturing process. Furthermore, a defect that occurs in the early stages of the production of electronic assemblies will propagate, causing additional rework cost at each step in the process that the PCB goes through without being detected as defective. This stresses the importance of early detection of not only obvious printing errors (e.g., extreme lack or excess of a solder paste deposit on a connection pad), but also of possible causes of other defects resulting e.g. from degradation of solder paste quality, loss of the working viscosity point, or even failures related to a printing machine with which the PCB printing process is carried out. Thus, any attempt to enhance the performance of the PCB manufacturing lines often start with the PCB printing process.

There may be a need for improving the reliability of a PCB printing process.

SUMMARY OF THE INVENTION

This need may be met by the subject matter according to the independent claims. Advantageous embodiments of the present invention are described by the dependent claims.

According to a first aspect of the invention there is provided a method for changing parameters for controlling a transfer of solder paste onto a printed circuit board. The provided method comprises (a) identifying first subareas of the printed circuit board, which exhibit a first repeatability with respect to the amount of solder paste being supposed to be transferred onto the printed circuit board, (b) identifying second subareas (252, 254) of the printed circuit board (150, 250), which exhibit a second repeatability with respect to the amount of solder paste being supposed to be transferred onto the printed circuit board (150, 250), wherein the first repeatability is smaller than the second repeatability, (c) transferring solder paste onto the printed circuit board at the second subareas of the printed circuit board, (d) measuring the amount of solder paste which has been transferred to the second subareas, and (e) changing the parameters for controlling a transfer of solder paste onto the printed circuit board in response to the measured amount of solder paste which has been transferred to the second subareas.

The described method is based on the idea that controlling a transfer of viscous solder paste onto a printed circuit board (PCB) can be very critical in particular when the viscous solder paste has to be applied through small apertures of the stencil. In many application cases in reality it will be even impossible to control the solder paste transfer through a small aperture of the stencil. As a consequence, taking into account the amount of solder paste which has been transferred through a small aperture of the stencil can lead to erroneous or at least non reliable control parameters. Based on these findings, the inventors of the described method found out that by excluding first subareas which are critical because of a comparatively small repeatability with respect to the amount of solder paste being transferred onto a PCB, reliable control parameters for controlling a transfer of solder paste onto the PCB can be determined by adapting or changing the solder paste transfer parameters.

In this respect a comparatively small repeatability with respect to the amount of solder paste being supposed to be transferred onto the PCB may mean that with one and the same printing configuration (e.g. material and/or thickness of the used stencil, printing speed, pressure with which the solder paste is pressed through the apertures of the stencil, viscosity of the solder paste, temperature, humidity, etc.) different amounts of solder paste will be transferred. This means that for the identified first subareas the amount of transferred solder paste cannot be predicted in a precise manner.

The repeatability can be given by the so called process capability index or process capability ratio which is a known statistical measure of process capability namely the ability to produce an output (here the amount of transferred solder paste) within certain specification limits. The repeatability can be given e.g. by the so called $C_p$ value which is indicative for the variance or the standard deviation of the printing process. Preferably, the repeatability is given by the so called $C_{pk}$ value which is indicative for the variance or the standard deviation of the printing process against a target value.

In this document the term "parameters for controlling a transfer of solder paste onto a printed circuit board" or shortly "printing parameters" may be any physically condition which in a printing process has an influence on the solder paste transfer. In this respect printing is the process during which solder paste is applied to the PCB through apertures formed within the stencil. Thereby, a squeegee blade is moved over a stencil being located on top of the PCB in such a manner that viscous solder paste is transferred into the apertures of the stencil. Afterwards, the PCB is removed from the stencil and depending on adhesion forces between the solder paste and the PCB the solder paste remains adhered at the PCB. Printing parameters are e.g. the speed of the squeegee blade, the length or a stroke of the movement of the squeegee blade over the stencil, the speed at which the PCB is removed from the stencil, etc.

It is pointed out that the (successful) approach found out by the inventors is in complete contradiction to the course of action which would normally be chosen by a person skilled in the art. Specifically, a person skilled in the art would normally focus on the critical first subareas exhibiting a comparatively small repeatability with respect to the transferred amount of solder paste when trying to change or to optimize parameters for controlling a solder paste transfer. By contrast thereto, the inventors took the opposite approach that if a sub-process (i.e. the transfer of solder paste through small apertures) cannot be controlled in a reliable manner it makes no sense to take this sub-process into account for a changing or optimizing of parameters for controlling a solder paste transfer. This means that in the described method the amount of solder paste which has been transferred to the first subareas is excluded when determining appropriate printing parameters.

According to an embodiment of the invention identifying first subareas of the printed circuit board is carried out based on (i) printed circuit board design data of the printed circuit board and based on (ii) stencil design data of a stencil being used for transferring the solder paste onto the printed circuit board by means of a solder paste printing procedure.

The stencil design data and/or the PCB design data may be in particular so called Gerber data, which are widely used in the production of electronic devices for identifying in a standardized manner the structural design of the stencil and of the PCB, respectively. Thereby, the term "structural design" refers to the spatial locations and/or sizes of e.g. conductor paths on the PCB, connection pads on the PCB, apertures in the stencil etc.

According to a further embodiment of the invention the method further comprises measuring at least one further characteristic quantity of the solder paste which has been transferred to the second subareas, wherein the further characteristic quantity is indicative for a volume, a height, a planarity, an area, a position, or a rotational orientation of the solder paste on the printed circuit board, which solder paste has been transferred to the second subareas. Thereby, changing the parameters for controlling a transfer of solder paste onto the printed circuit board is further based on the measured at least one further characteristic quantity.

This may provide the advantage that the performance of the solder paste transfer within the second subareas can be evaluated with a particular high precision. This allows for changing or optimizing the parameters for controlling a transfer of solder paste onto the printed circuit board in a highly reliable manner. As a consequence, the quality of further solder paste transfer processes onto PCB's will be enhanced.

The height of the transferred solder paste may be given in particular by the difference between (a) a maximum height level of the transferred solder paste and (b) the height level of a connection pad on the PCB, onto which connection pad the solder paste has been transferred.

The planarity of the transferred solder paste may be defined by a possible variation of the height of the transferred solder paste over the area (parallel to the surface of the PCB). Thereby, the smaller these height variations are, the better is the planarity.

The area of the transferred solder paste may be in particular the area (parallel to the surface of the PCB) of the PCB which area is covered by the transferred solder paste. Thereby, it may be possible that the transferred solder paste being assigned to one connection pad may cover only a part of this connection pad or may extend laterally over the lateral boundary of the connection pad.

The position of the transferred solder paste may be given by a possible offset (parallel to the surface of the PCB) between the transferred solder paste and the connection pad being assigned to this solder paste transfer. Such an offset may result e.g. from a wrongly positioned stencil and/or from an impreciseness of the stencil, wherein the apertures are not formed at correct positions. The offset may be in particular a so called X-Y offset within a Cartesian X-Y coordinate system of the PCB.

The rotational orientation may be given by a possible angular mismatch between the transferred solder paste and the connection pad being assigned to this solder paste transfer. Such an angular mismatch may result e.g. when there has been an unwanted relative rotation between the PCB and the stencil within the plane of the PCB and/or the stencil.

According to a further embodiment of the invention the identified first subareas are assigned to surface areas of the stencil in which the apertures in the stencil have a comparatively small area ratio and the second subareas are assigned to surface areas of the stencil in which the apertures have a comparatively large area ratio, wherein the area ratio for an aperture of the stencil is defined by the ratio between (a) a spatial overlap area between (b1) the opening of the aperture and (b2) a corresponding pad on a PCB to which the aperture is assigned and onto which the solder paste is supposed to be transferred and (b) the area of the sidewall of the aperture.

Using the area ratio in order to decide about how critical a subarea of the PCB is may provide the advantage that a differentiation between the comparatively critical first subareas exhibiting a comparatively small repeatability and the comparatively uncritical second subareas exhibiting a comparatively large repeatability can be realized in a highly reliable manner. In this respect the area ratio is a suitable quantity which takes into account boundary effects of the aperture (i.e. in the course of the solder paste transfer through the aperture a part of the solder paste may remain adhered to the sidewalls of the aperture). The area ratio is closely related to the so called solder paste transfer efficiency which is the term being commonly used to describe how much solder paste has been actually transferred through the aperture of the stencil onto the corresponding connection pad of the PCB in relation to the designed (or expected) amount of solder paste.

In this respect it is mentioned that the area ratio being assigned to any aperture in the stencil can be calculated theoretically exclusively based on the Gerber data of the stencil and on the Gerber data of the PCB. This means that the first step of the described method can be carried out at a point in time where the real stencil has not yet been produced.

According to a further embodiment of the invention the method further comprises distinguishing different classes of second subareas wherein each class is assigned to a certain range of area ratios. Thereby, changing the parameters for controlling a transfer of solder paste onto the printed circuit board is carried out individually for each class of second subareas.

Descriptive speaking, according to this embodiment of the invention the solder paste transfer process can be virtually subdivided into different sub-processes. Since each sub-process is assigned to a certain range of area ratios individual difficulties may arise for each sub-process. Therefore, for each sub-process individual control parameters for controlling a transfer of solder paste will be optimal and will, according to the embodiment described here, be changed or optimized.

Further, it is stated that in cases where the area ratio or design parameters from a comparison between PCB Gerber data and stencil Gerber data show that a particular set of apertures and pads will result in a print process which will probably not result in statistically controllable results in the amount, the volume, the height or any other characteristic quantity of a solder paste deposit, the subareas being assigned to this particular set of apertures will be excluded from the described determination of solder paste transfer control parameters.

In this respect it is mentioned that for a mass production of PCB it will probably not be effective to aggregate the solder paste transfer respectively the printing process taken from different sub-processes each being assigned to a certain range of area ratios. For an efficient mass production for each PCB a common set of parameters for controlling a transfer of solder paste onto a PCB should not be used. Further, having a detailed knowledge about the optimal control parameters for each sub-process may provide the advantage that the parameters for controlling a transfer of solder paste onto the whole PCB can be determined in a precise and reliable manner.

It is further mentioned that the described method can also be carried out repeatedly such that a plurality of PCBs will be provided with solder paste. In this case it will be possible to perform a statistical analysis with regard to the optimal printing control parameters. Preferably such a statistical analysis may be based on average measured values and on standard deviations of the measured values. In case the solder paste transfer process is virtually subdivided into different sub-processes such a statistical analysis can be carried out for each sub-process. This may allow for determining even further optimized control parameters for controlling a transfer of solder paste onto the PCB.

In other words, by dividing the solder paste transfer onto a PCB into a set of sub-processes the solder paste transfer will become more predictable.

Standard statistics can be used along with a set of logic rules to identify process deterioration or localized process problems.

According to a further embodiment of the invention the method further comprises transferring solder paste onto the printed circuit board at the first subareas of the printed circuit board. This may provide the advantage that for transferring solder paste it is not necessary to exclude the first subareas though in accordance with the invention for changing the control parameters the solder paste which has been transferred to the first subareas will not be taken into account. As a consequence, a usual solder paste transfer procedure or printing procedure can be used. It is not necessary to perform a modified solder paste transfer procedure in order to carry out the described method.

According to a further embodiment of the invention the method further comprises measuring the amount of solder paste which has been transferred to the first subareas. This may provide the advantage that for measuring the amount of transferred solder paste it is not necessary to define a modified measuring or inspection process which excludes the first subareas. As a consequence, a usual solder paste inspection can be used. It is not necessary to perform a modified solder paste inspection in order to carry out the described method.

At this point it is mentioned that in addition to measuring the amount of solder paste which has been transferred to the first subareas also at least one of the above mentioned further characteristic quantities can be measures for the solder paste which has been transferred to the first subareas.

According to a further embodiment of the invention the transfer of solder paste to the second subareas and/or to the first subareas is carried out by means of a solder paste printing machine. This may provide the advantage that the described method for determining parameters for controlling a transfer of solder paste onto a PCB can be carried out with a usual Solder Paste Printer (SPP). There is no need to make any changes to the hardware of such a SPP. The described method can be realized simply by a software modification.

According to a further embodiment of the invention measuring the amount of solder paste which has been transferred to the second subareas and/or to the first subareas of the printed circuit board is carried out by means of a solder paste inspecting machine. This may provide the advantage that the described method can be carried out with a usual Solder Paste Inspecting (SPI) machine. There is no need to make any changes to the hardware of such a SPI machine such that described method can be realized simply by a software modification.

The SPI machine may measure in a known manner the amount (and if applicable also the at least one further characteristic quantity) of the transferred solder paste by means of an Automatic Optical Inspection (AOI) procedure. For such an AOI e.g. known three dimensional laser measurement or Moire fringe interferometry techniques can be used.

According to a further aspect of the invention there is provided a processing device for changing parameters for controlling a transfer of solder paste onto a printed circuit board. The provided processing device comprises (a) a first processing unit for identifying first subareas of the printed circuit board, which exhibit a first repeatability with respect to the amount of solder paste being supposed to be transferred onto the printed circuit board, and for identifying second subareas of the printed circuit board, which exhibit a second repeatability with respect to the amount of solder paste being supposed to be transferred onto the printed circuit board, wherein the first repeatability is smaller than the second repeatability, (b) a triggering unit comprising an interface which is connectable to a solder paste printing machine and to a solder paste inspecting machine, wherein the triggering unit is configured for prompting the solder paste printing machine to transfer solder paste onto the printed circuit board at the second subareas of the printed circuit board, and wherein the triggering unit is further configured for prompting the solder paste inspecting machine to measure the amount of solder paste which has been transferred to the second subareas, and (c) a second processing unit for changing the parameters for controlling a transfer of solder paste onto the printed circuit board in response to the measured amount of solder paste which has been transferred to the second subareas.

The described processing device is based on the idea that appropriate parameters for controlling a transfer of solder paste onto a PCB can be achieved in a precise and reliable manner when the result of solder paste transfers to first subareas, which exhibit a comparatively poor repeatability with respect to the amount of solder paste being transferred, are excluded respectively are not taken into account for the optimization of the printing control parameters.

It is mentioned that prompting the solder paste inspecting machine to measure the amount of solder paste which has been transferred to the second subareas can be carried out either directly from the processing device to the solder paste inspecting machine or indirectly from the processing device via the solder paste printing machine to the solder paste inspecting machine.

According to a further aspect of the invention there is provided a system for changing parameters for controlling a transfer of solder paste onto a printed circuit board. The provided system comprises (a) a solder paste printing machine, (b) a solder paste inspecting machine, and (c) a processing device as described above. Thereby, the processing device is connected both to the solder paste printing machine and to the solder paste inspecting machine in order to allow the processing device to control the operation of the solder paste printing machine and to receive inspection data obtained from the solder paste inspecting machine.

According to a further aspect of the invention there is provided a computer program for changing parameters for controlling a transfer of solder paste onto a printed circuit board. The provided computer program, when being executed by a processing device, is operative to control and/or to carry out the above described method for changing parameters for controlling a transfer of solder paste onto a printed circuit board.

As used herein, reference to a computer program is intended to be equivalent to a reference to a program element and/or to a computer readable medium containing instructions for controlling a computer system to coordinate the performance of the above described method.

The computer program may be implemented as a computer readable instruction code in any suitable programming language, such as, for example, JAVA, C++, and may be stored on a computer-readable medium (removable disk, volatile or non-volatile memory, embedded memory/processor, etc.). The instruction code is operable to program a computer or any other programmable device to carry out the intended functions. The computer program may be available from a network, such as the World Wide Web, from which it may be downloaded.

The invention may be realized by means of a computer program respectively software. However, the invention may also be realized by means of one or more specific electronic circuits respectively hardware. Furthermore, the invention may also be realized in a hybrid form, i.e. in a combination of software modules and hardware modules.

It has to be noted that embodiments of the invention have been described with reference to different subject matters. In particular, some embodiments have been described with reference to method type claims whereas other embodiments have been described with reference to apparatus type claims. However, a person skilled in the art will gather from the above and the following description that, unless other notified, in addition to any combination of features belonging to one type of subject matter also any combination between features relating to different subject matters, in particular between features of the method type claims and features of the apparatus type claims is considered as to be disclosed with this document.

The aspects defined above and further aspects of the present invention are apparent from the examples of embodiment to be described hereinafter and are explained with reference to the examples of embodiment. The invention will be described in more detail hereinafter with reference to examples of embodiment but to which the invention is not limited.

DETAILED DESCRIPTION

Figure 1:
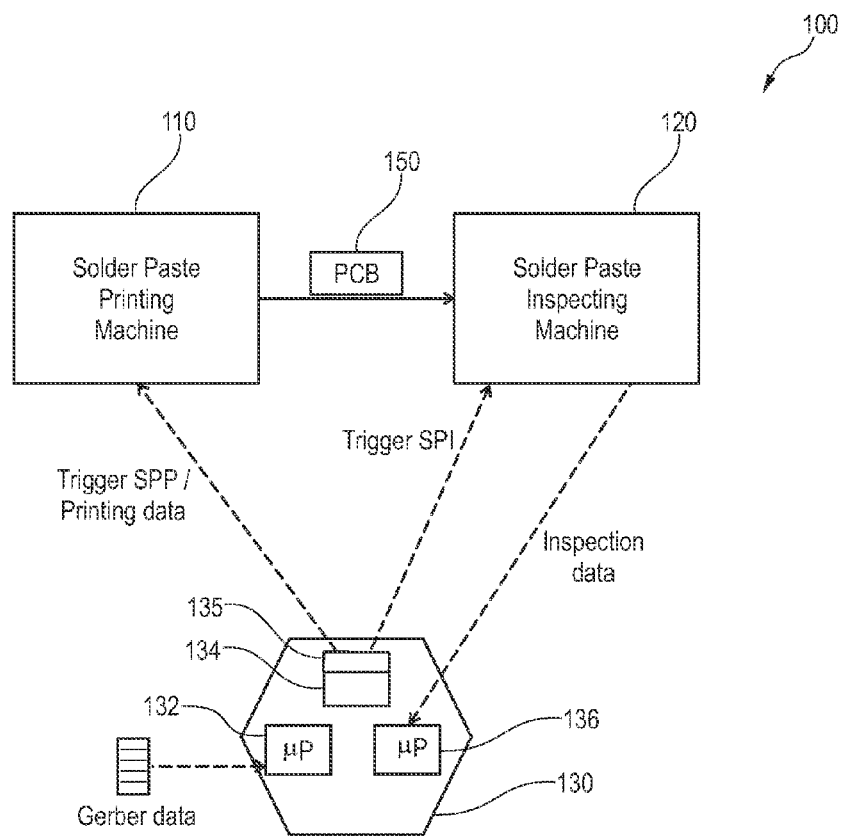
FIG. 1 shows a system for changing parameters for controlling a transfer of solder paste onto a printed circuit board.

The illustration in the drawing is schematically. It is noted that in different figures, similar or identical elements or features are provided with reference signs, which are different from the corresponding reference signs only within the first digit. In order to avoid unnecessary repetitions elements or features which have already been elucidated with respect to a previously described figure are not elucidated once again at a later position of the description.

FIG. 1 shows a system 100 for changing parameters for controlling a transfer of solder paste onto a printed circuit board (PCB) 150. The system 100 comprises a solder paste printing (SPP) machine 110, a solder paste inspecting (SPI) machine 120, and a processing device 130. The processing device 130 comprises a first processing unit 132, a triggering unit 134 and a second processing unit 136. The triggering unit 134 comprises an interface 135 via which the processing device 130 is connected both to the SPP machine 110 and to the SPI machine 120. In the following it will be described how in accordance with a preferred embodiment of the invention a method for changing parameters for controlling a transfer of solder paste onto a PCB can be carried out.

In the beginning (i) PCB design data of the PCB 150 and (ii) stencil design data of a stencil (not depicted) being used for transferring the solder paste onto the PCB 150 are input to the first processing device 132. According to the embodiment described here these design data are given in a so called Gerber format. Accordingly these design data are called Gerber data.

Based on the Gerber data the first processing device 132 identifies first subareas of the surface of the PCB 150, which first subareas are comparatively critical with respect to the amount of solder paste being supposed to be transferred onto the PCB 150. Further, the first processing device 132 identifies second subareas of the surface of the PCB 150, which second subareas are comparatively uncritical with respect to the amount of solder paste being supposed to be transferred onto the PCB 150. Thereby, critical means that the repeatability of the solder paste transfer process with respect to the amount of transferred solder paste is comparatively small. Correspondingly, uncritical means that the repeatability of the solder paste transfer process with respect to the amount of transferred solder paste is comparatively large.

According to the embodiment described here the first subareas are subareas in which there are located connection pads wherein in a printing process each connection pad which is supposed to be provided with a solder paste deposit and which is assigned to an area ratio being smaller than an area ratio being assigned to connection pads of the other second subareas. Thereby, the area ratio is given by the ratio between (a) a spatial overlap area between (b1) the opening of the aperture and (b2) a corresponding pad on a PCB to which the aperture is assigned and onto which the solder paste is supposed to be transferred and (b) the area of the sidewall of the aperture. This means that the connection pads within the first subareas are comparatively small and the connection pads within the second subareas are comparatively large.

When the first subareas have been identified the triggering unit 134 of the processing device 130 prompts the SPP machine 110 to transfer solder paste onto the PCB 150 at least within the second subareas. When prompting the SPP machine 110 via the interface 135 according to the embodiment described here also the corresponding printing data (i.e. gerber data and/or the values of printing process control parameters) are transferred to the SPP machine 110. In accordance with the described embodiment a common printing process is used both for the first subareas and for the second subareas. This means that solder paste is also transferred to the connection pads being located within the first subareas.

After finishing the printing process the PCB 150 is transferred to the SPI machine 120 via a not depicted conveyor. Further, a measurement by the SPI machine 120 is triggered by the triggering unit 134. However, it is mentioned that the SPI machine 120 might also be triggered indirectly by the SPP machine 110.

By means of the triggered or prompted SPI machine 120 the solder paste deposits which have been produced by the SPP machine 110 within the second subareas are optically measured e.g. via a known 3D laser scanning or a Moire fringe interferometry system. Specifically, the amounts of solder paste which has been transferred to the respective connection pads are measured. According to the embodiment described here the SPP machine 110 measures not only the solder paste transfer within the second subareas but also the solder paste transfer within the first subareas.

After having finished measuring the amount of solder paste which has been transferred to the PCB 150 the corresponding inspection data are forwarded from the SPI machine 120 to the second processing unit 136 of the processing device 130. Based on the received inspection data parameters for controlling a transfer of solder paste onto further printed circuit boards are determined by the second processing unit 136 based on the measured amount of solder paste which has been transferred to the second subareas.

Figure 2:
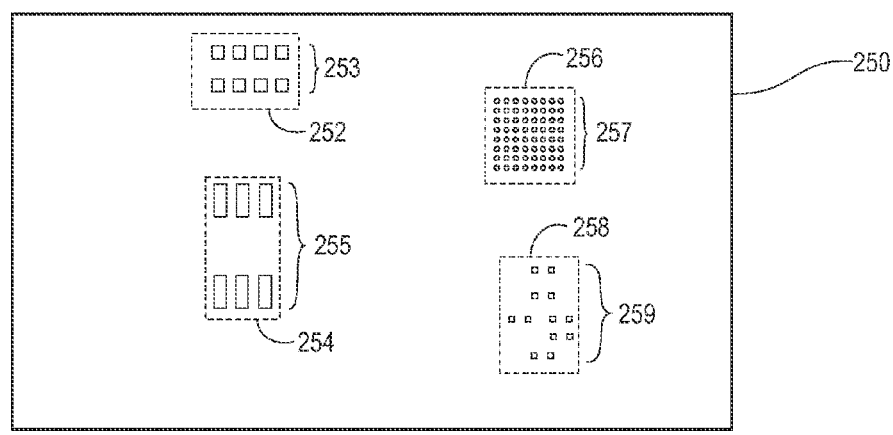
FIG. 2 shows a printed circuit board with a surface area being subdivided into different subareas, wherein for a following printing process the connection pads of each subarea are assigned to a certain area ratio range.

FIG. 2 shows a printed circuit board 250 with a surface area being subdivided into different subareas 252, 254, 256, 258, wherein for a following printing process the connection pads of each subarea 252, 254, 256, 258 are assigned to a certain area ratio range.

Figure 2A:
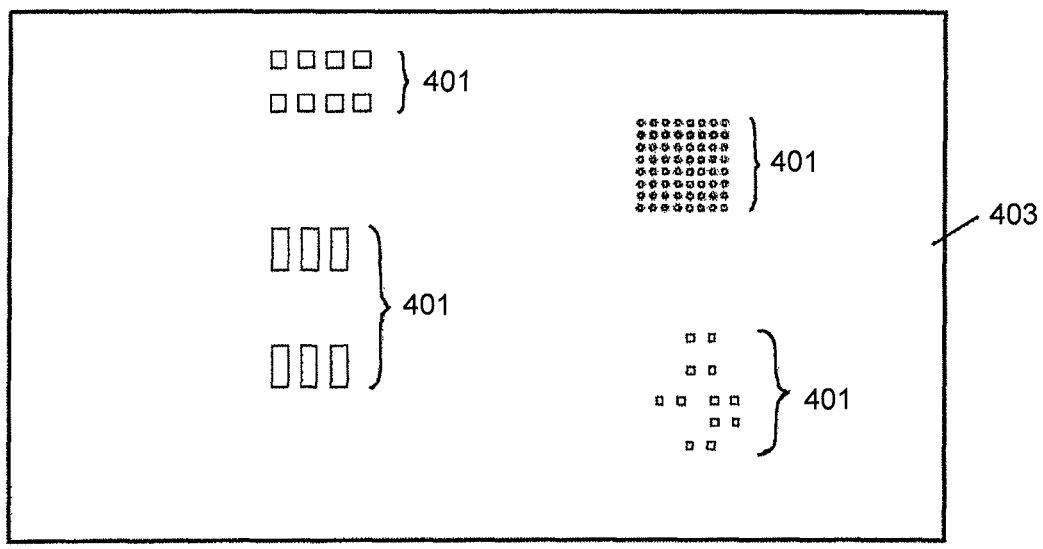
FIG. 2A shows a stencil with apertures.

As can be seen from the exemplary embodiment shown in FIG. 2, within the subarea 252 there are provided comparatively large connection pads 253 for a so called Small Outline Dual Inline Package (SO DIP) component. Within the subarea 254 there are provided even larger connection pads 255 for electrically and mechanically attaching a connector (e.g. a Universal Serial Bus (USB) connector). Further, within the subarea 258 there are provided comparatively small connection pads 259 for altogether six passive components such as capacitors or resistors. Furthermore, within subarea 256 there are provided even smaller connection pads 257 for a so called Ball Grid Array (BGA) component. According to the embodiment described here in the following the subareas 252 and 254 are assigned to second subareas because the connection pads 253, 255 being assigned to these subareas 252, 254 are comparatively large. Accordingly, the subareas 256 and 258 are assigned to the first subareas because the respective connection pads 257, 259 being assigned to these subareas 256, 258 are comparatively small. Thereby, it is assumed that the solder paste transfer to the connection pads 253 and 255 is uncritical and comprises a comparatively large repeatability with respect to the amount of solder paste being supposed to be transferred. By contrast thereto, it is assumed that the solder paste transfer to the connection pads 257 and 259 is critical and comprises a comparatively poor repeatability with respect to the amount of solder paste being supposed to be transferred because the area ratio of the corresponding apertures 401 within the stencil 403 being used for printing is relatively large, as shown in FIG. 2A. This may mean that it is likely that during the transfer of solder paste at least some solder paste remains adhered to the sidewalls of the corresponding apertures.

Figure 3:
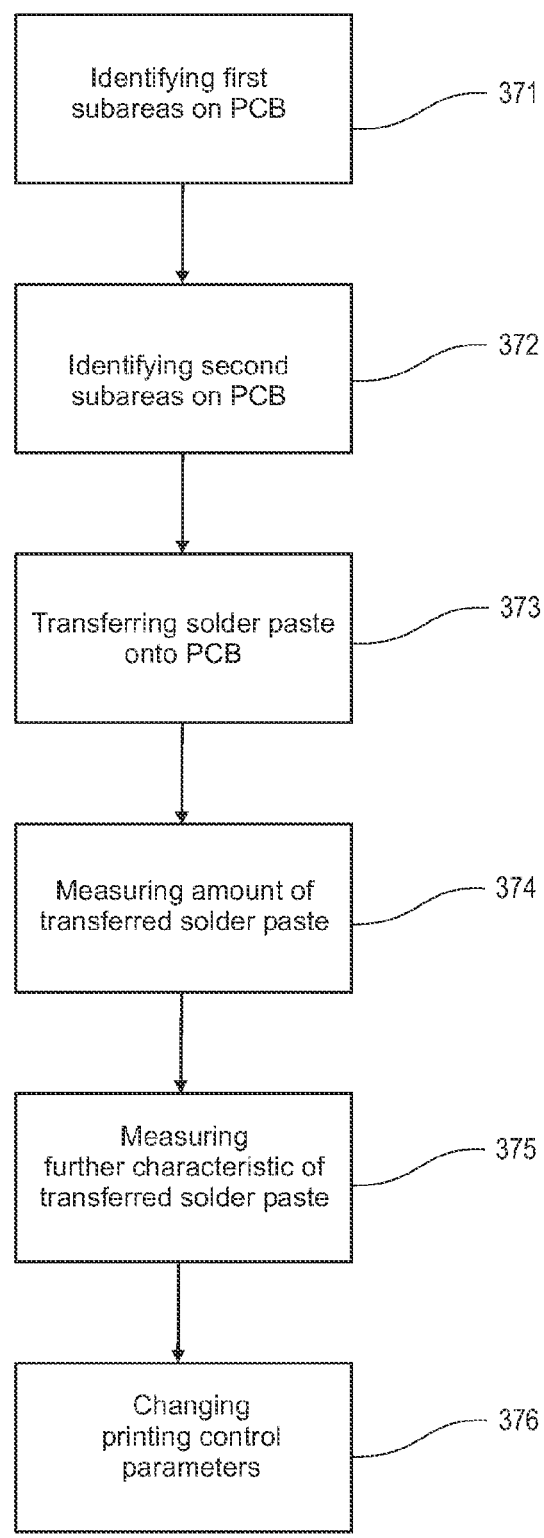
FIG. 3 shows a flow diagram illustrating a method of changing parameters for controlling a transfer of solder paste onto a printed circuit board.

FIG. 3 shows a flow diagram illustrating a preferred method of determining parameters for controlling a transfer of solder paste onto a PCB.

In a first step 371 there are identified first subareas of the PCB, which first subareas are critical or exhibit a comparatively poor repeatability with respect to the amount of solder paste being supposed to be transferred onto the PCB by means of a solder paste printing procedure. Thereby, the identification of the first subareas is carried out based on (i) PCB design data and (ii) stencil design data of a stencil being used for transferring the solder paste onto the PCB.

In a second step 372 there are identified second subareas of the PCB, which second subareas are uncritical or exhibit a comparatively high repeatability with respect to the amount of solder paste being supposed to be transferred onto the PCB by means of a solder paste printing procedure. According to the embodiment described here also the identification of the second subareas is carried out based on (i) PCB design data and (ii) stencil design data of a stencil being used for transferring the solder paste onto the PCB.

According to the embodiment described here the identified first subareas are assigned to surface areas of the stencil in which the apertures in the stencil have a comparatively small area ratio and the second subareas are assigned to surface areas of the stencil in which the apertures have a comparatively large area ratio. Thereby, the area ratio for an aperture of the stencil is defined by the ratio between (a) a spatial overlap area between (b1) the opening of the aperture and (b2) a corresponding pad on a PCB to which the aperture is assigned and onto which the solder paste is supposed to be transferred and (b) the area of the sidewall of the aperture.

In a third step 373 which is accomplished in a SPP machine the solder paste is transferred onto the printed circuit board at least at the second subareas of the PCB. In accordance with the embodiment described here a common printing process is used both for the first subareas and for the second subareas. This means that solder paste is also transferred to the connection pads being located within the second subareas. Thereafter, the PCB is transferred to a SPI machine via a conveyor.

In a fourth step 374 which is accomplished in the SPI machine solder paste deposits which have been produced by the SPP machine within the second subareas are optically measured. Thereby, the amounts of solder paste which have been transferred to the respective connection pads are measured.

According to the embodiment described here the SPI machine measures not only the solder paste transfer within the second subareas but also the solder paste transfer within the first subareas. This has the advantage that for realizing the described method a known Automated Optical Inspection (AOI) procedure can be used.

In a fifth step 375 there is measured at least one further characteristic quantity of the solder paste which has been transferred to the second subareas. Thereby, the further characteristic quantity may be indicative for a volume, a height, a planarity, an area, or a position of the solder paste deposits on the PCB, which solder paste deposits have been transferred to the second subareas of the PCB. Again, not only the solder paste transfer within the second subareas but also the solder paste transfer within the first subareas is measured.

In a sixth step 376 the parameters for controlling a transfer of solder paste onto further PCBs are changed based on (i) the measured amount of solder paste which has been transferred to the second subareas and further based on (ii) the measured at least one further characteristic quantity of the solder paste deposits within the second subareas.

It should be noted that the term "comprising" does not exclude other elements or steps and the use of articles "a" or "an" does not exclude a plurality. Also elements described in association with different embodiments may be combined. It should also be noted that reference signs in the claims should not be construed as limiting the scope of the claims.

LIST OF REFERENCE SIGNS

100 System for determining parameters for controlling a transfer of solder paste onto a printed circuit board
110 Solder paste printing machine
120 Solder paste inspecting machine
130 Processing device
132 First processing unit
134 triggering unit
135 Interface
136 Second processing unit
150 Printed circuit board
250 Printed circuit board
252 second subarea
253 connection pads for SO DIP component)
254 further second subarea
255 connection pads for connection terminal
256 first subarea
257 connection pads for BGA component
258 further first subarea
259 connection pads passive components
371 first step
372 second step
373 third step
374 fourth step
375 fifth step
376 sixth step

The invention claimed is:

1. A method for changing parameters for controlling a transfer of solder paste onto a printed circuit board, the method comprising
identifying first subareas of the printed circuit board, which exhibit a first repeatability with respect to the amount of solder paste being supposed to be transferred onto the printed circuit board,
identifying second subareas of the printed circuit board, which exhibit a second repeatability with respect to the amount of solder paste being supposed to be transferred onto the printed circuit board, wherein the first repeatability is smaller than the second repeatability,
wherein the steps of identifying the first and second subareas of the printed circuit board are based on (i) printed circuit board design data of the printed circuit board and based on (ii) stencil design data of a stencil being used for transferring the solder paste onto the printed circuit board by means of a solder paste printing procedure;
wherein the identified first subareas are assigned to surface areas of the stencil in which the apertures in the stencil have a comparatively small area ratio and the identified second subareas are assigned to surface areas of the stencil in which the apertures have a comparatively large area ratio, wherein the area ratio for an aperture of the stencil is defined by the ratio between
(a) a spatial overlap area between the opening of the aperture and a corresponding pad on a printed circuit board to which the aperture is assigned and onto which the solder paste is supposed to be transferred and
(b) the area of the sidewall of the aperture;
transferring solder paste onto the printed circuit board at least at the second subareas of the printed circuit board,
measuring the amount of solder paste which has been transferred to the second subareas, and
changing the parameters for controlling a transfer of solder paste onto the printed circuit board in response to the measured amount of solder paste which has been transferred to the second subareas and not to the first subareas.

2. The method as set forth in claim 1, further comprising measuring at least one further characteristic quantity of the solder paste which has been transferred to the second subareas, wherein the further characteristic quantity is indicative for a volume, a height, a planarity, an area, a position, or a rotational orientation of the solder paste on the printed circuit board, which solder paste has been transferred to the second subareas, wherein changing the parameters for controlling a transfer of solder paste onto the printed circuit board is further based on the measured at least one further characteristic quantity.

3. The method as set forth in claim 1, further comprising distinguishing different classes of second subareas wherein each class is assigned to a certain range of area ratios, wherein changing the parameters for controlling a transfer of solder paste onto the printed circuit board is carried out individually for each class of second subareas.

4. The method as set forth in claim 1, further comprising transferring solder paste onto the printed circuit board at the first subareas of the printed circuit board.

5. The method as set forth in claim 4, further comprising measuring the amount of solder paste which has been transferred to the first subareas.

6. The method as set forth in claim 1, wherein the transfer of solder paste to the second subareas and/or to the first subareas is carried out by means of a solder paste printing machine.

7. The method as set forth in claim 1, wherein measuring the amount of solder paste which has been transferred to the second subareas and/or to the first subareas of the printed circuit board is carried out by means of a solder paste inspecting machine.

* * * * *